US008705262B1

(12) United States Patent
Law

(10) Patent No.: US 8,705,262 B1
(45) Date of Patent: *Apr. 22, 2014

(54) STACKED MEMORY DEVICE FOR A CONFIGURABLE BANDWIDTH MEMORY INTERFACE

(71) Applicant: Apple Inc., Cupertino, CA (US)

(72) Inventor: Patrick Y Law, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/859,430

(22) Filed: Apr. 9, 2013

Related U.S. Application Data

(63) Continuation of application No. 13/191,624, filed on Jul. 27, 2011, now Pat. No. 8,437,164.

(51) Int. Cl.
*G11C 5/06* (2006.01)

(52) U.S. Cl.
USPC ................. 365/63; 365/51; 365/72; 365/129

(58) Field of Classification Search
USPC ......................................................... 365/129
See application file for complete search history.

(56) References Cited

U.S. PATENT DOCUMENTS

| | | | |
|---|---|---|---|
| 6,542,393 B1 | 4/2003 | Chu et al. | |
| 6,705,877 B1 | 3/2004 | Li et al. | |
| 6,751,113 B2 * | 6/2004 | Bhakta et al. | 365/63 |
| 7,126,837 B1 * | 10/2006 | Banachowicz et al. | 365/63 |
| 7,547,630 B2 | 6/2009 | Gerber | |
| 7,826,243 B2 * | 11/2010 | Bruce et al. | 365/51 |
| 8,218,347 B1 * | 7/2012 | Law et al. | 365/63 |
| 8,238,134 B2 | 8/2012 | Matsui et al. | |
| 8,437,164 B1 * | 5/2013 | Law | 365/63 |
| 2002/0061665 A1 | 5/2002 | Batinovich | |
| 2009/0090950 A1 | 4/2009 | Forbes et al. | |

OTHER PUBLICATIONS

Whitepaper: 'UWIO Organization', Intel, Jul. 21, 2011, pp. 1-7.
Whitepaper: 'Future High Bandwidth Memory—Memory Channel Count', Elpida Memory, Inc, Jul. 27, 2011, pp. 1-8.

* cited by examiner

*Primary Examiner* — Tan T. Nguyen
(74) *Attorney, Agent, or Firm* — Stephen J. Curran; Meyertons, Hood, Kivlin, Kowert & Goetzel, P.C.

(57) ABSTRACT

A stacked memory device for a configurable bandwidth memory interface includes a first number of contact pads arranged in a pattern on a first surface of the memory device and a second number of contact pads arranged in the same pattern on a second surface. Each of the second contact pads may be electrically coupled to a corresponding contact pad on the first surface using a via. When the memory device is oriented in a first orientation and stacked in vertical alignment and electrical connection upon a second memory device having the same pattern of contact pads, each data signal of the memory bus is coupled to a corresponding data signal of both the memory devices. When the memory device is oriented in a second orientation, a given data signal of the memory bus is coupled to the corresponding data signal of only one of the memory devices.

18 Claims, 7 Drawing Sheets

STACKED MEMORY DEVICE FOR A CONFIGURABLE BANDWIDTH MEMORY INTERFACE

PRIORITY INFORMATION

This application is a continuation of U.S. patent application Ser. No. 13/191,624, entitled "Stacked Memory Device For A Configurable Bandwidth Memory Interface," now U.S. Pat. No. 8,437,164, filed Jul. 27, 2011, which is incorporated herein in its entirety.

BACKGROUND

1. Technical Field

This disclosure relates to memory devices and more particularly to stacked memory device bus structures.

2. Description of the Related Art

Recent advances in manufacturing capability has allowed memory device manufacturers to begin creating devices in which individual memory device die are stacked one on top of the other. More particularly, to allow the signals from a top die to be routed to a bus or other interface at the bottom of the stack, a technique referred to as through silicon vias (TSV) is used. There are various ways of implementing TSV, but the basic concept is that holes are created through each die from one side to the other, and the holes are metallized. When the dice are aligned and mechanically bonded, a die-to-die electrical pathway (or bus) is created from each signal on the top die all the way through all of the dice to a contact pad on the bottom surface of the bottom die. The die-to-die connections may be made using a bump process, for example. Some advantages of using stacked devices are the lead lengths are more uniform and shorter than typical circuit board traces. Accordingly, memory bus speed may be increased with less signal distortion. However, a disadvantage of using a TSV flow during manufacturing is added cost. Thus, it would be desirable for memory architectures that use the TSV flow to have a higher return on investment.

SUMMARY OF THE EMBODIMENTS

Various embodiments of a stacked memory device for a configurable bandwidth memory interface are disclosed. In one embodiment, the memory device includes a first number of contact pads arranged in a pattern on a first surface of the memory device. The memory device also includes a second number of contact pads arranged in the same pattern on a second surface of the memory device. Each contact pad of the second number of contact pads may be electrically coupled to a corresponding contact pad on the first surface using a via. Some of both the first and the second contact pads are further coupled to data signals of the memory device for connection to a memory bus. In response to the memory device being oriented in a first orientation and stacked in vertical alignment and electrical connection upon a second memory device having the same pattern of contact pads, each data signal of the memory bus is coupled to a corresponding data signal of both the memory device and the second memory device. However, in response to the memory device being oriented in a second orientation, a given data signal of the memory bus is coupled to the corresponding data signal of one of the memory device or the second memory device. In other words, by re-orienting the memory device, each memory device may have exclusive access to corresponding respective data signals of the memory bus.

In one implementation, in the first orientation the memory device and the second memory device provide a memory system having a number of ranks and a number of channels corresponding to the number of channels of one of the memory devices, and in the second orientation the memory device and the second memory device provide a memory system having a single rank and a number of channels corresponding to twice the number of channels of one of the memory devices.

Figure 1:
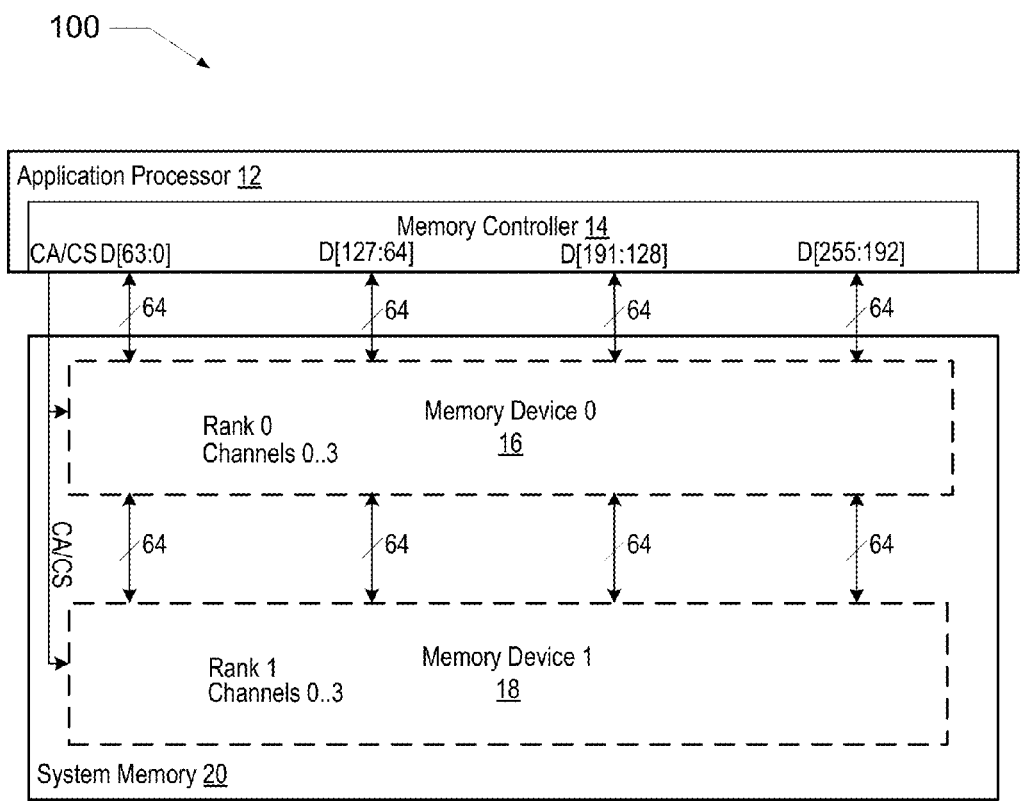
FIG. 1 is a block diagram of one embodiment of a system including an application processor and a system memory including a number of memory devices.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a system including an application processor and a system memory is shown. The system 100 includes an application processor 12 coupled to the system memory 20, which includes memory devices 0 and 1, (designated 16 and 18, respectively).

In one embodiment, the application processor 12 may be representative of any of a variety of processors used to execute instructions. As shown, the application processor 12 includes a memory controller 14 that may be configured to control the memory transactions between the application processor 12 and the memory devices 16 and 18.

In one embodiment, each memory device 16 and 18 may be a device in the dynamic random access memory (DRAM) family of devices. Accordingly, each memory device may include one or more memory arrays, buffers, drivers, and control logic (all not shown). In addition, each memory device 16 and 18 includes a data bus having a number of data bits. In the illustrated configuration, the data bus includes 256 bits, although other configurations may include other numbers of data bits. Each DRAM may include several memory segments or channels. In the illustrated configuration, each DRAM corresponds to a separate memory rank and the two memory devices together represent a two-rank memory stack having the number of channels that are in one DRAM. This DRAM stack may be referred to as having 1× channels.

As shown, the memory controller 14 includes a memory interface that includes data bus connections and control, address, and chip select (e.g., CA/CS) connections that are coupled to each of the memory devices 0 and 1. In the illustrated embodiment, the memory interface includes 256 such data bus connections and they are designated as D[255:0]. However, as shown the data bus is partitioned into four 64-bit channels. In the illustrated embodiment, each memory device 16 and 18 may operate in a double data rate (DDR) mode, as described further below. In this configuration (i.e., a two-rank, four channel configuration) the memory bus bandwidth may be 4×64b at 200 MHz DDR. Thus, since each of the data bus bits is connected to both memory devices 0 and 1, the application processor 12 only sees the four channels, but sees twice the depth in the two ranks. It is noted that in other embodiments, each DRAM may have other numbers of channels. It is also noted that the illustrated data bit assignment is merely one of many possible configurations, and other bit assignments are possible and contemplated.

Figure 2:
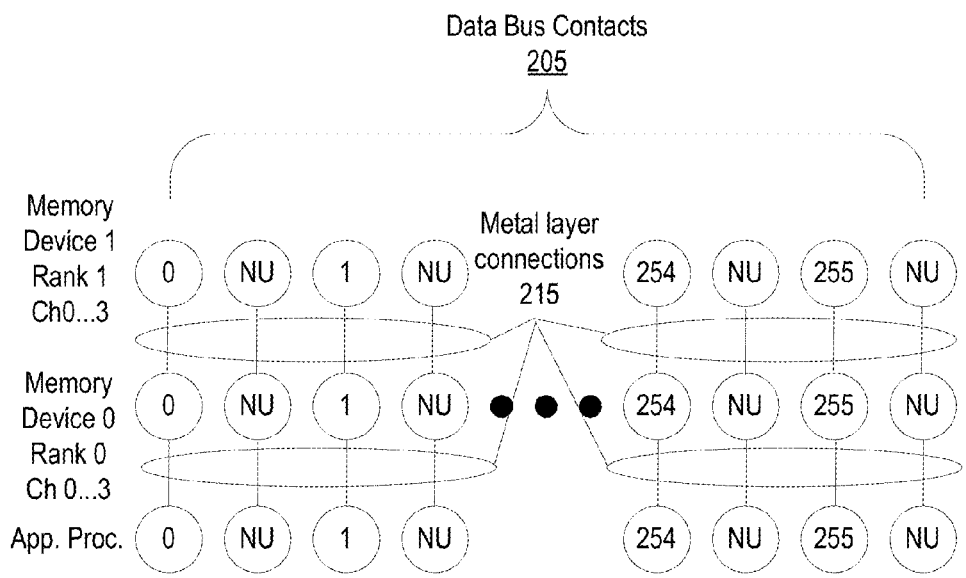
FIG. 2 is a diagram illustrating the chip-to-chip data bus connections of an embodiment of the memory devices shown in FIG. 1.

Referring to FIG. 2, a wiring diagram illustrating the chip-to-chip bus connections of an embodiment of the memory devices shown in FIG. 1 is shown. In FIG. 2, the data bus contact pads 205 are shown in rows and columns. These rows and columns represent a two dimensional view of the data bus connections as they would be in a stacked memory bus architecture. The data bus contact pads of the application processor 12 are shown on the bottom row, the data bus contacts for the memory device 0 are on top of the application processor 12 represented by row two, and the data bus contact pads for the memory device 1 are on top of the contact pads for memory device 0, as represented by row three. As mentioned above this diagram represents a two-rank memory configuration with 1× channels.

In the illustrated embodiment, every other data bit is unused in both the application processor pinout and the memory devices 0 and 1 and may be thought of as a feed-through, and each data bit of the memory data bus is shared by both memory devices. As shown, the vias in the memory devices provide connections in vertical alignment from the bottom surface of the memory device die to the top surface of the memory device die. As each device is stacked on top, the contact pads of one device are vertically aligned with the contact pads of another device. This is represented by the vertical metal layer connections 215.

In the illustrated embodiment, the memory device data bus contact pads for memory devices 0 and 1 are numbered from left to right as zero, NU, one, NU . . . 254, NU, 255, NU, thereby representing 512 contacts in which only half of the data bus contacts are used. Accordingly, the application processor 12 has a 256-bit memory data bus and is configured and numbered in such a way as to mate with the stacked memory devices to have the correct data bit aligned with the correct contact on the memory device stack. In other words, if viewed from the top, each of the semiconductor die of the memory devices and the application processor would include contact pads that are arranged to have the same footprint so that when stacked the contact pads are aligned. In the illustrated embodiment, the application processor data bus numbering matches the numbering scheme used in FIG. 1.

Accordingly, as shown in FIG. 1 and partially in FIG. 2, both memory devices 0 and 1 are connected to data bus contacts 63:0, 127:64, 191:128, and 255:192. Thus, in FIG. 2 data bit zero of the application processor 12 is coupled to the data bit zero contact pads of the memory devices 0 and 1 through the TSV and metal layer connections of memory device 0. Represented generally, memory devices 0 and 1 share channels 0:n-1.

Figure 3:
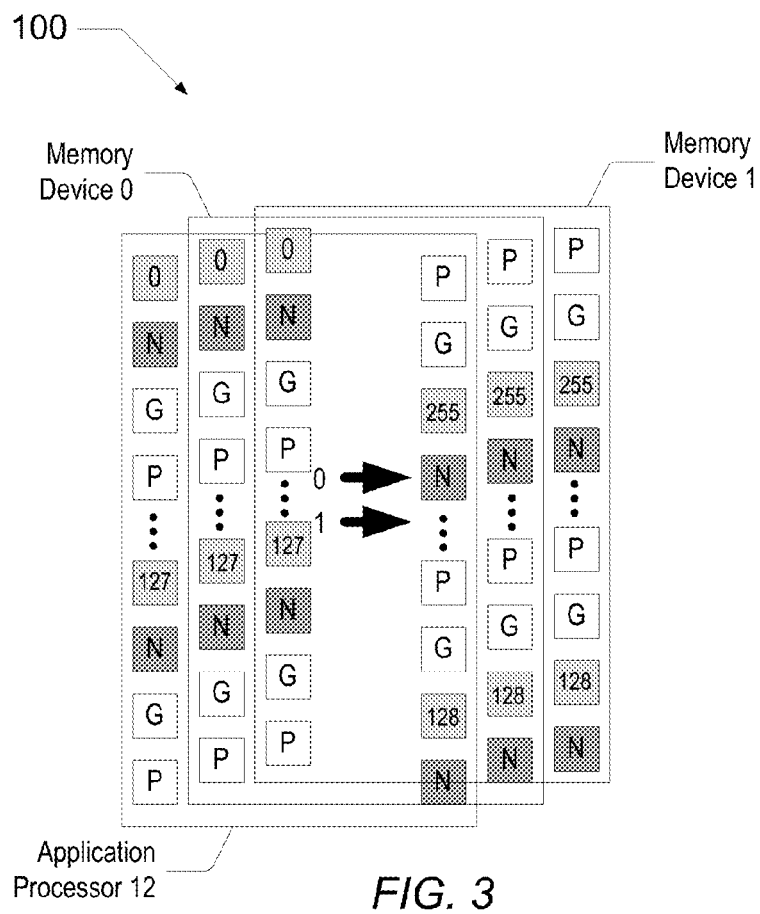
FIG. 3 is a top view diagram depicting a pin assignment and orientation of an embodiment of the stacked memory devices of FIG. 1 and FIG. 2.

Referring to FIG. 3, a top view diagram depicting a pin assignment and orientation of an embodiment of the stacked memory devices of FIG. 1 and FIG. 2 is shown. In FIG. 3, memory devices 0 and 1, and application processor 12 are shown. The data bus contact pads are designated with a data bus pin number, the unused contact pads are designated with an 'N', and the power and circuit ground contact pads are designated with a 'P' and 'G', respectively. Accordingly, the system 100 of FIG. 3 illustrates an exemplary sample of data bus contact pads and power and circuit ground contact pads and their arrangement. In addition, as shown, both the memory devices 0 and 1 have the same orientation (as indicated by the arrows). In this way, as shown in FIG. 2, the data bus contact pads and the power and ground contact pads are appropriately aligned.

However, as described in greater detail below in conjunction with the descriptions of FIG. 4 through FIG. 6, the arrangement of the contact pads on the memory devices and the selection of the pin assignment to those contact pads allows for flexibility in the memory bus configuration. More particularly, with the pin assignment and arrangement shown in FIG. 3, one of the memory devices may be rotated to have a 180-degree orientation to provide more memory channels, and thus greater memory data bus width.

Figure 4:
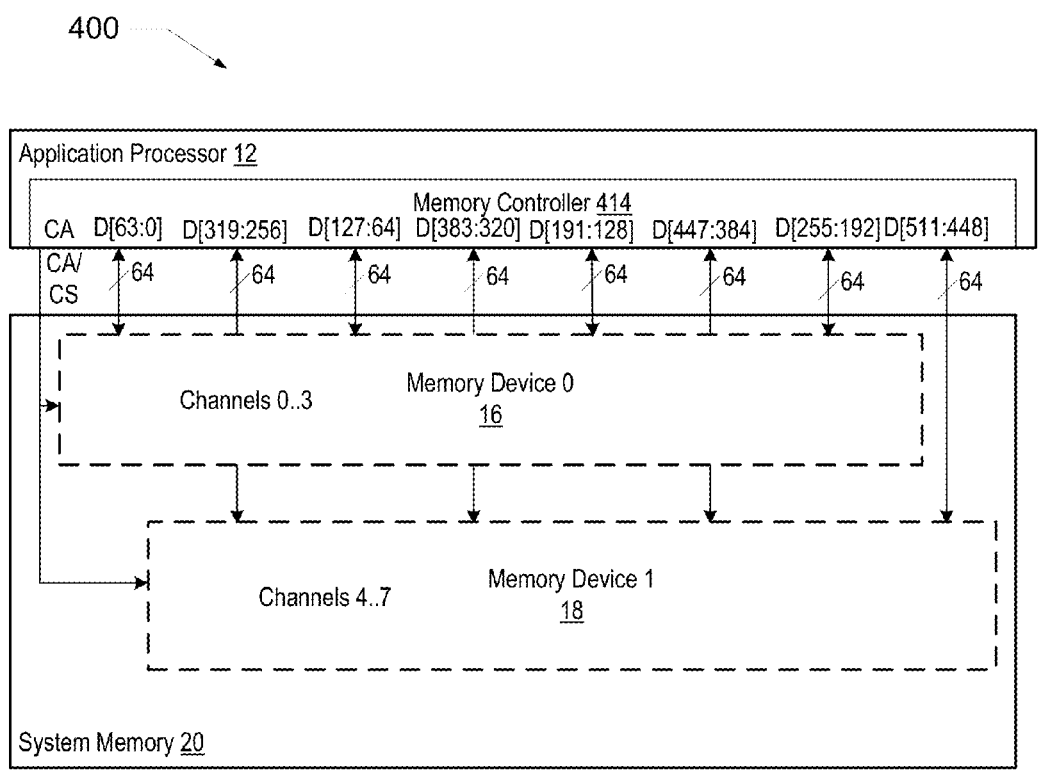
FIG. 4 is a block diagram of another embodiment of a system including an application processor and a system memory including a number of memory devices.

Turning to FIG. 4, a block diagram of another embodiment of a system including an application processor and a number of memory devices is shown. Components that correspond to those shown in FIG. 1 and FIG. 2 are numbered identically for clarity and simplicity. Similar to the system 100 shown in FIG. 1, the system 400 includes also an application processor 12 coupled to a system memory 20 that includes memory devices 0 and 1, and which are designated 16, and 18, respectively. However as shown, the memory controller 414 has a 512-bit memory data bus. To accommodate this larger bus width, the system memory 20 has a single-rank, 2× channels (e.g., channel [0:3] and channel [4:7]) configuration. Thus, in contrast to the configuration shown in FIG. 1, the application processor 12 now sees two times the number of channels (i.e., 2× channels) in each DRAM, but only one rank.

In this configuration, the memory bus bandwidth may be 8×64b at 200 MHz DDR. As shown, data bits 255:0 are coupled to memory device 0, while data bits 511:256 are coupled to memory device 1 in 64-bit channel groupings. It is noted that the illustrated data bit assignment is merely one of many possible configurations, and other bit assignments are possible and contemplated.

As described further below, this memory data bus configuration may be accommodated using the same memory devices as those used in the system of FIG. 1 through FIG. 3, but with a simple change in orientation of one of the memory devices.

Figure 5:
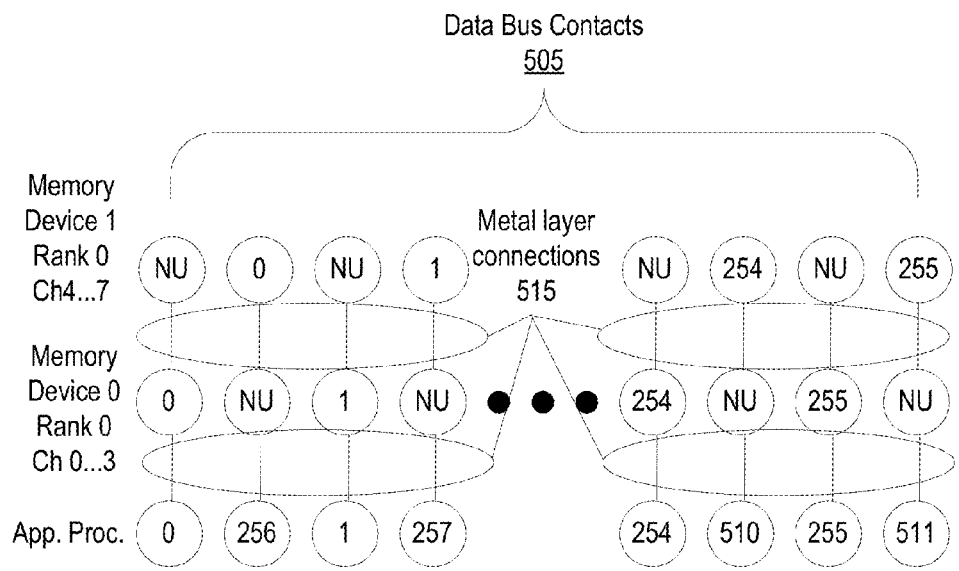
FIG. 5 is a diagram illustrating the chip-to-chip data bus connections of the embodiment of the memory devices shown in FIG. 4.
Figure 6:
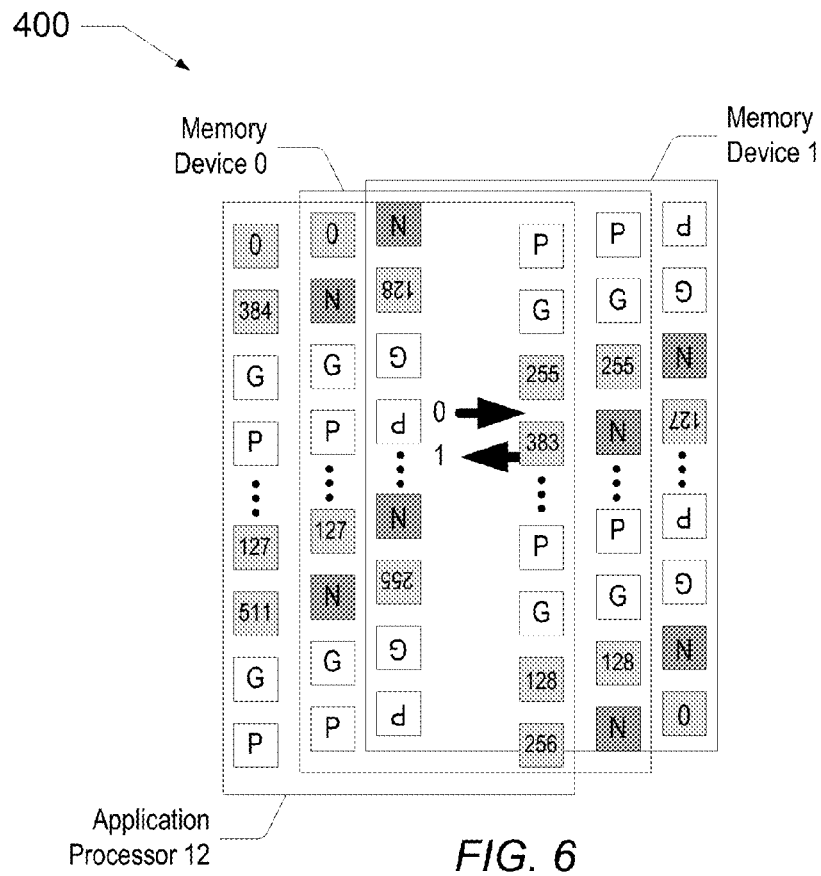
FIG. 6 is a top view diagram depicting a pin assignment and orientation of an embodiment of the stacked memory devices of FIG. 4 and FIG. 5.

Referring to FIG. 5, a wiring diagram illustrating the chip-to-chip bus connections of an embodiment of the memory devices shown in FIG. 4 is shown. Similar to FIG. 2, the data bus contact pads 505 of FIG. 4 are shown in rows and columns. These rows and columns represent a two dimensional view of the bus connections as they would be in a stacked memory bus architecture. The data bus contact pads of the application processor 12 are shown on the bottom row, the data bus contacts for the memory device 0 are on top of the application processor 12 represented by row two, and the data bus contact pads for the memory device 1 are on top of the contact pads for memory device 0, as represented by row three. As mentioned above this diagram represents a 2×-channels, single-rank memory configuration. It is noted that the data bus numbering corresponds to the numbering used in FIG. 4.

As shown, the metal layer connections 515 of the memory devices of FIG. 5 are configured similar to the metal layer connections shown in the diagram of FIG. 2. However, because the memory device 1 has been re-oriented 180-degrees, as shown in FIG. 6, the data bus bit assignments are different on each memory device. Accordingly, a data bus bit on one memory device is now vertically aligned with an unused (e.g., NU) contact pad of the other memory device. Thus, each memory device is connected to a dedicated data bus.

More particularly, application processor data bit zero is coupled to data bit zero of memory device 0. Since memory device 1 does not use that contact (designated NU), memory device 0 has exclusive use of that data bus bit. Similarly for data bit one of the application processor 12. Data bit 256 is connected to data bit zero of memory device 1 through the TSV and metal layer connections of memory device 0. However, as shown, that contact is unused by memory device 0. The remaining data bus bits are connected in a similar way. In the illustrated embodiment, memory device 0 has channels 0:3, while memory device 1 has channels 4:7, thus there are 2×4=8 total channels. Represented generally, memory device 0 has channels 0:n-1, while memory device 1 has channels n:2n-1.

As mentioned above, to achieve the configuration shown in FIG. 4 and FIG. 5, rather than using a different type of memory device, one of the memory devices may simply be rotated 180-degrees. More particularly, as shown in FIG. 6, memory device 1 has simply been rotated 180-degrees to a new orientation (as indicated by the arrows and the upside down contact pad designators). The existing pin assignment still allows the power and circuit ground contact pads to have the same vertical alignment as before, but the data bus contact pads are now aligned to have the connections as shown in FIG. 5. In this configuration, none of the data bus bits are shared between memory devices 0 and 1. Thus, the DRAM stack of the system 400 creates a single-rank 2× channels configuration.

Figure 7:
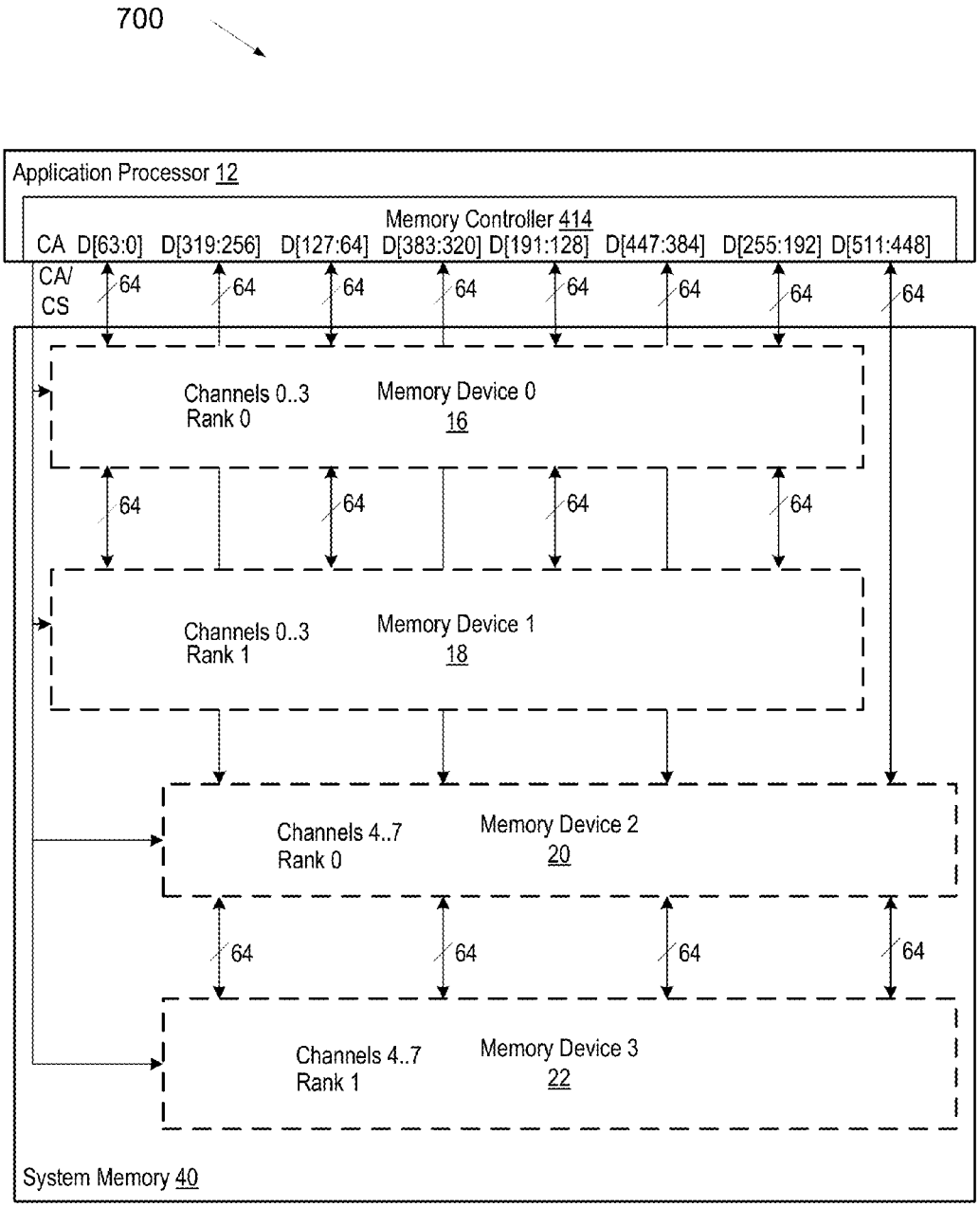
FIG. 7 is a block diagram of another embodiment of a system including an application processor and a system memory including a number of memory devices.

Turning to FIG. 7, a block diagram of another embodiment of a system including an application processor and a number of memory devices is shown. Components that correspond to those shown in other figures are numbered identically for clarity and simplicity. The system 700 includes an application processor 12 coupled to a system memory. Similar to the system 400 of FIG. 4, the memory controller 414 of FIG. 7 also has a 512-bit memory data bus. However, the system memory 40 of FIG. 7 includes memory devices 0, 1, 2, and 3, and which are designated 16, 18, 20, and 22, respectively. In addition, the system memory 40 has a two-rank, 2×-channels configuration. Accordingly, data bus bits 255:0 are coupled to memory devices 0 and 1, and data bus bits 511:256 are coupled to memory devices 2 and 3. It is noted that the illustrated data bit assignment is merely one of many possible configurations, and other bit assignments are possible and contemplated. As described in greater detail below, this configuration may be accommodated by using the memory device orientations shown in both FIG. 3 and FIG. 6 together.

Figure 8:
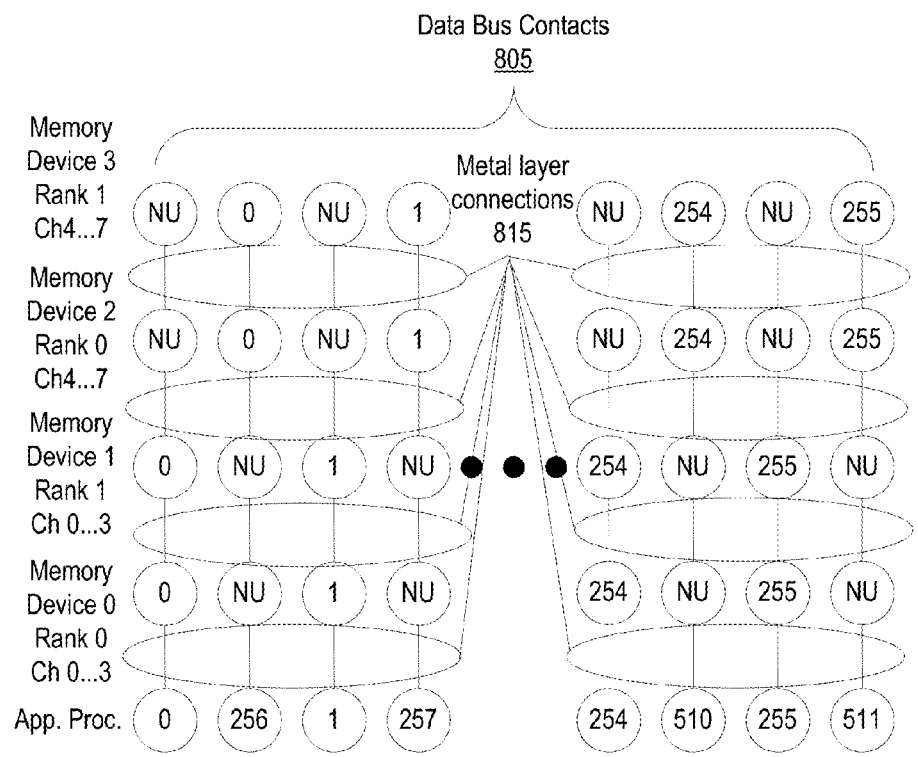
FIG. 8 is a diagram illustrating the chip-to-chip data bus connections of an embodiment of the memory devices shown in FIG. 7.

Referring to FIG. 8, a wiring diagram illustrating the chip-to-chip bus connections of an embodiment of the memory devices shown in FIG. 7 is shown. Similar to FIG. 2 and FIG. 5, the data bus contact pads 805 of FIG. 8 are shown in rows and columns. These rows and columns represent a two dimensional view of the bus connections as they would be in a stacked memory bus architecture. The data bus contact pads of the application processor 12 are shown on the bottom row, and the respective data bus contacts for each of the memory devices 0-3 are stacked on top of the application processor 12. As mentioned above this diagram represents a 2×-channels, two-rank memory configuration. It is noted that the data bus numbering corresponds to the numbering used in FIG. 7. However, it is noted that in other embodiments other data bus numbering schemes are possible and contemplated.

As shown, the metal layer connections 815 of the memory devices of FIG. 8 are configured similar to the metal layer connections shown in the diagrams of FIG. 2 and FIG. 5. However, because the memory devices 2 and 3 have been re-oriented 180-degrees from the orientation of memory devices 0 and 1, the data bus bit assignments are different on memory devices 2 and 3 than they are on memory devices 0 and 1. Thus, data bus bits are shared between memory device 0 and memory device 1 and also between memory device 2 and memory device 3, but the data bus bits are not shared between memory devices 0 and 1, and memory device 2 and 3. Accordingly, as shown a data bus bit on a pair of memory devices (e.g., devices 0 and 1) is now vertically aligned with an unused (e.g., NU) contact pad of the other pair of memory devices (e.g., devices 2 and 3). Thus, each pair of memory devices is connected to a dedicated data bus.

More particularly, application processor data bit zero is coupled to bit zero of memory devices 0 and 1. Since memory devices 2 and 3 do not use that contact (designated NU), memory devices 0 and 1 have exclusive use of that data bus bit. Similarly for data bit 256 of the application processor 12. Data bit 256 is connected to data bit zero of memory devices 2 and 3 through the TSV and metal layer connections of memory devices 0 and 1. However, as shown, that contact is unused by memory devices 0 and 1. The remaining data bus bits are connected in a similar way. Represented generally, memory devices 0 and 1 share channels 0:n-1, while memory devices 2 and 3 share channels n:2n-1.

Figure 9:
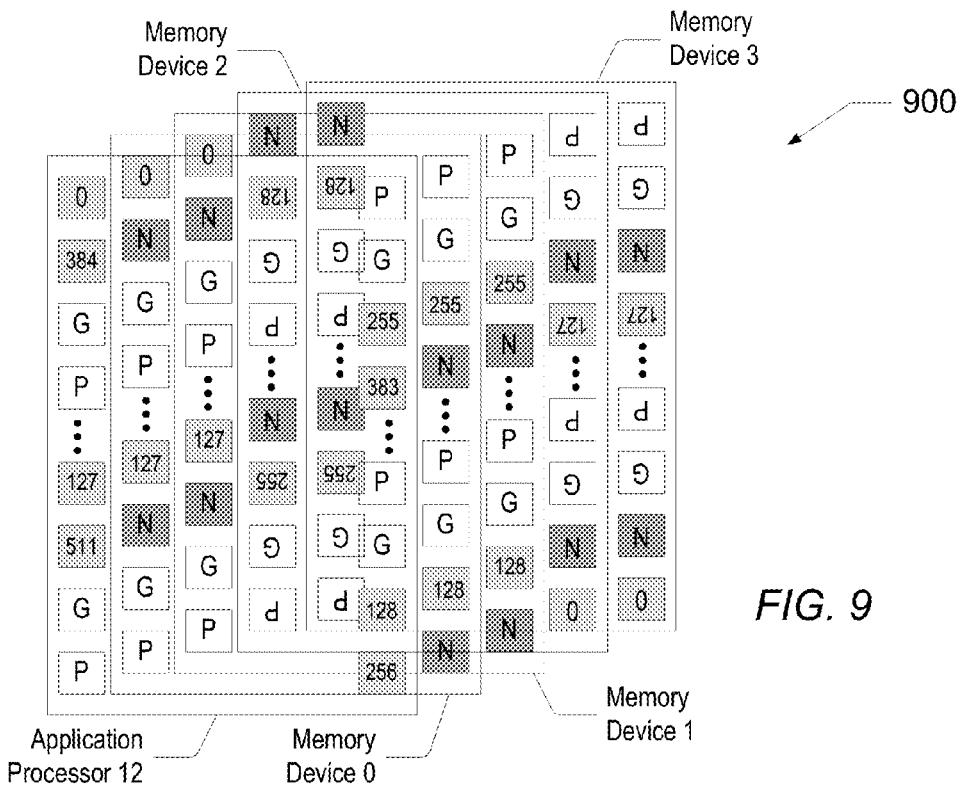
FIG. 9 is a top view depicting a pin assignment and orientation of an embodiment of the stacked memory devices of FIG. 7 and FIG. 8.

As mentioned above, to achieve the configuration shown in FIG. 7 and FIG. 8, rather than using a different type of memory device, two of the memory devices may simply be rotated together 180-degrees. More particularly, similar to FIG. 6 and as shown in FIG. 9 memory devices 2 and 3 have simply been rotated 180-degrees to a new orientation (as indicated by the upside down contact pad designators). The same pin assignment allows the power and circuit ground contact pads to have the same vertical alignment as before, but the data bus contact pads are now aligned to have the connections as shown in FIG. 8. In this configuration, a given data bus bit is shared by only two memory devices. As shown in previous embodiments, when two devices share a data bus bit, those two memory devices share the same channels and represent two ranks. Accordingly, memory devices 0 and 1 are share channels 0:3, and memory devices 2 and 3 are share channels 4:7. Thus, the DRAM stack of the system 900 of FIG. 9 creates a two-rank, 2× channels configuration.

It is noted that one way to view the contact pad arrangement in the embodiments described above is that each memory device (e.g., 16, 18, 20, and 22) may include several rows of contact pads on one surface of the die (e.g., a top surface), and several rows of contact pads on a second surface of the die (e.g., a bottom surface) that opposes the first surface. The contact pads in the rows on one surface are arranged so that they are vertically aligned with the contact pads on the other surface. Then each vertically aligned contact pad on one surface is electrically coupled to a corresponding contact pad on the opposing surface with the TSVs. In addition, each memory device may include several rows of external data contact pads that connect via metal layers to the contact pads. These external contact pads may be the pads that are used to connect to the next device using a solder joint or solder ball, for example. In addition, the terms top surface and bottom surface are used for discussion purposes only since the memory devices may be arranged in a flip-chip configuration such that the die is physically arranged upside down. That is, each die is positioned with the active (i.e., circuit) side down.

It is also noted that although the above embodiments include specific data bus contact numbers and number of data bits, it is contemplated that in other embodiments other numberings and other numbers of bits may be used as desired.

It is further noted that although the above memory configurations are shown being used as a system memory used with an application processor, it is contemplated that memory devices (e.g., 16-22) may also be used in a graphics subsystem in which they are coupled with a graphics processor.

Thus, by planning out the pin assignment and arrangement of the contact pads on the memory device, the memory device may be used in more than one configuration by a simple change in device orientation.

Figure 10:
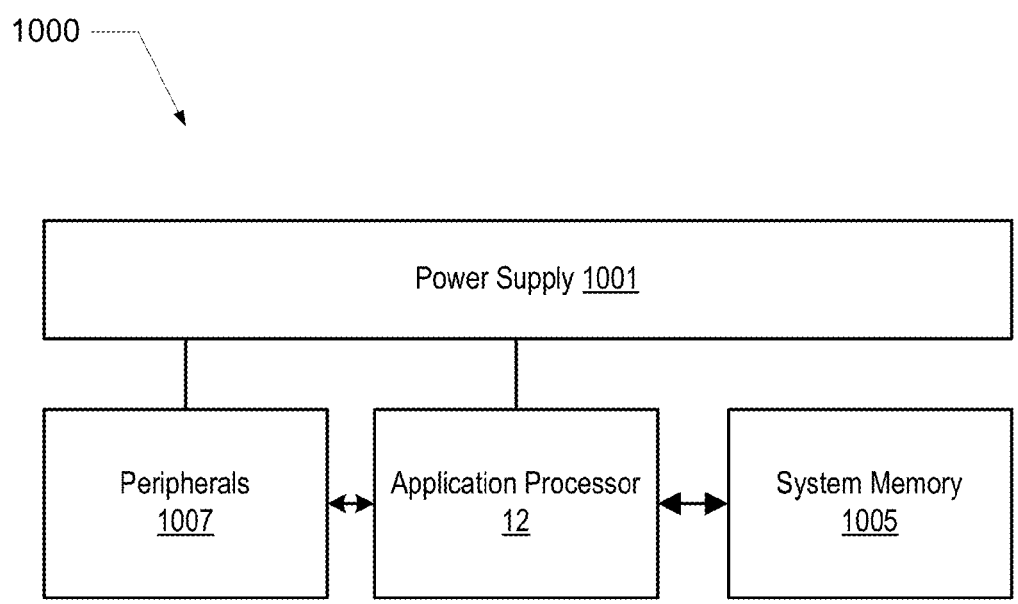
FIG. 10 is a block diagram of one embodiment of a system that includes the system memory devices of FIG. 1 through FIG. 9.

Turning to FIG. 10, a block diagram of one embodiment of a system that includes an application processor coupled to a system memory is shown. The system 1000 includes at least one instance of an application processor 12 coupled to one or more peripherals 1007 and a system memory 1005. A power supply 1001 is also provided which supplies the supply voltages to the application processor 12 as well as one or more supply voltages to the system memory 1005 (through the application processor 12) and/or the peripherals 1007. In one embodiment, application processor 12 may include a memory controller as shown in FIG. 1 and FIG. 3, such that application processor 12 may be considered as a system on a chip (SOC).

The peripherals 1007 may include any desired circuitry, depending on the type of system 1000. For example, in one embodiment, the system 1000 may be included in a mobile device (e.g. personal digital assistant (PDA), smart phone, etc.) and the peripherals 1007 may include devices for various types of wireless communication, such as WiFi, Bluetooth, cellular, global positioning system, etc. The peripherals 1007 may also include additional storage, including RAM storage, solid-state storage, or disk storage. The peripherals 1007 may include user interface devices such as a display screen, including touch display screens or multitouch display screens, keyboard or other input devices, microphones, speakers, etc. In other embodiments, the system 700 may be included in any type of computing system (e.g. desktop personal computer, laptop, workstation, net top etc.).

The system memory 1005 may include any type of memory. For example, as described above in conjunction with FIG. 1, the system memory 1005 may be dynamic RAM (DRAM) such as synchronous DRAM (SDRAM), double data rate (DDR, DDR2, DDR3, etc.). However, system memory 1005 may also be implemented in SDRAM, static RAM (SRAM), or other types of RAM, etc. As described above, in one embodiment, the system memory 1005 may include one or more memory device die stacked together and stacked onto the application processor 12 as shown in FIG. 2, FIG. 5, and FIG. 8.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory device comprising:
 a first surface including a first plurality of contact pads arranged in a pattern;
 a second surface including a second plurality of contact pads arranged in the pattern, wherein each contact pad of the second plurality of contact pads is electrically coupled to the corresponding contact pad using a via;
 wherein at least some of the first and the second plurality of contact pads are further coupled to data signals of the memory device for connection to a memory bus;
 wherein the memory device is configured to be stacked in vertical alignment and electrical connection upon a second memory device having a same pattern of contact pads as the memory device using a first orientation and a second orientation;
 wherein in response to the memory device being oriented in the first orientation, each data signal of the memory bus is shared between the memory device and the second memory device; and
 wherein in response to the memory device being oriented in the second orientation, each of the memory device and the second memory device has exclusive access to respective ones of the data signals of the memory bus.

2. The memory device as recited in claim 1, wherein in the first orientation the memory device and the second memory device provide a memory system having a plurality of ranks and a number of channels corresponding to the number channels of the memory device.

3. The memory device as recited in claim 1, wherein in the second orientation the memory device and the second memory device provide a memory system having a single rank and a number of channels corresponding to twice the number channels of the memory device.

4. The memory device as recited in claim 1, wherein a second portion of both the first and the second plurality of contact pads corresponds to power for the memory device, and a third portion of both the first and the second plurality of contact pads corresponds to circuit ground for the memory device.

5. The memory device as recited in claim 4, wherein the second memory device shares the power and the circuit ground contacts of the memory bus with the memory device in both the first orientation and the second orientation.

6. The memory device as recited in claim 4, wherein the first and the second plurality of contact pads are arranged in rows on the first and second surfaces, respectively, and wherein unused contact pads are arranged among the contact pads of the first portion of the first and the second plurality of contact pads, wherein the unused contact pads provide a connection from the first surface to the second surface.

7. The memory device as recited in claim 6, wherein the first and second plurality of contact pads are arranged such that a power and circuit ground contact pad pair are arranged between groups of the first portion of the first and the second plurality of contact pads, wherein each group includes a predetermined number of contact pads.

8. The memory device as recited in claim 1, further comprising a semiconductor die that includes an active circuit area including a memory array and an internal data bus having a plurality of internal data signals, wherein the internal data signals are coupled to the data signals of the memory device.

9. The memory device as recited in claim 1, wherein the memory bus includes 512 data signal paths.

10. The memory device as recited in claim 1, wherein the memory bus includes command and address signals.

11. A memory subsystem comprising:
a plurality of memory devices mounted one on top of the other and electrically coupled to one another through a plurality of vias, wherein each memory device includes:
a memory bus including a plurality of data signals and a plurality of address and control signals;
a first plurality of contact pads arranged in a pattern on a first surface of the memory device;
a second plurality of contact pads arranged in a same pattern on a second surface of the memory device, wherein each contact pad of the second plurality of contact pads is electrically coupled to the corresponding contact pad using a respective via;
wherein a first portion of both the first and the second plurality of contact pads are further coupled to the data signals of each memory device;
wherein in response to all of the memory devices being oriented in a first orientation, each data signal of the memory bus is coupled to a corresponding data signal of all of the memory devices; and
wherein in response to a first portion of the memory devices being oriented in the first orientation and a second portion of the memory devices being oriented in a second orientation, the first portion of memory devices and the second portion of the second memory devices has exclusive access to respective ones of the data signals of the memory bus.

12. The memory subsystem as recited in claim 11, wherein in the first orientation the memory subsystem includes a plurality of ranks and a number of channels corresponding to the number channels of the memory device, and wherein a chip select signal selects which memory device has access to the memory bus.

13. The memory subsystem as recited in claim 11, wherein in the second orientation the memory subsystem includes a plurality of ranks and a number of channels corresponding to twice the number channels of the memory device, and wherein a chip select signal selects which memory device of the first portion and which memory device of the second portion has access to the memory bus.

14. A method comprising:
arranging a first plurality of contact pads in a pattern on a first surface of a first memory device;
arranging a second plurality of contact pads in a same pattern on a second surface of the first memory device, wherein each contact pad of the second plurality of contact pads is electrically coupled to a corresponding contact pad on the first surface using a via;
connecting a first portion of both the first and the second plurality of contact pads to data signals of the memory device for connection to a memory bus;
connecting each data signal of the memory bus to a corresponding data signal of both the first memory device and the second memory device in response to orienting in a first orientation and stacking in vertical alignment and electrical connection the first memory device upon a second memory device having the same pattern of contact pads; and
orienting the first memory device in a second orientation such that the first device is in vertical alignment and electrical connection with the same pattern of contact pads of the second device thereby providing exclusive access by both the first device and the second device to each data signal of the memory bus.

15. The method as recited in claim 14, further comprising asserting a chip select signal to select one of the first memory device or the second memory device to have access to the memory bus in response to orienting in a the first memory device in the first orientation.

16. The method as recited in claim 14, further comprising positioning unused contact pads among the contact pads of the first and the second plurality of contact pads to form the particular pattern, wherein the unused contact pads provide a connection from a given contact pad on the first surface to a corresponding contact pad on the second surface.

17. The method as recited in claim 16, further comprising interleaving a power and circuit ground contact pad pair between groups of contact pads, wherein each group includes a predetermined number of data signal contact pads and unused contact pads.

18. The method as recited in claim 14, wherein orienting the first memory device upon the second memory device in the second orientation comprises rotating the first memory device 180 degrees.

* * * * *